(12) United States Patent
Ren et al.

(10) Patent No.: US 9,614,156 B2
(45) Date of Patent: Apr. 4, 2017

(54) METHOD FOR PRODUCING FLEXIBLE DISPLAY PANEL

(71) Applicant: BOE TECHNOLOGY GROUP CO., LTD., Beijing (CN)

(72) Inventors: Qingrong Ren, Beijing (CN); Wei Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 14/762,183

(22) PCT Filed: Sep. 18, 2014

(86) PCT No.: PCT/CN2014/086842
§ 371 (c)(1),
(2) Date: Jul. 20, 2015

(87) PCT Pub. No.: WO2015/188493
PCT Pub. Date: Dec. 17, 2015

(65) Prior Publication Data
US 2016/0248012 A1 Aug. 25, 2016

(30) Foreign Application Priority Data
Jun. 12, 2014 (CN) .......................... 2014 1 0262342

(51) Int. Cl.
*H01L 51/00* (2006.01)
*H01L 27/32* (2006.01)
(Continued)

(52) U.S. Cl.
CPC .......... *H01L 51/003* (2013.01); *G02F 1/1333* (2013.01); *H01L 21/84* (2013.01);
(Continued)

(58) Field of Classification Search
CPC ..... H01L 21/84; H01L 27/12; H01L 27/3241; H01L 27/3248; H01L 51/0024; H01L 51/0097; H01L 27/1214; H01L 27/1266
See application file for complete search history.

(56) References Cited

U.S. PATENT DOCUMENTS 7,282,385 B2 * 10/2007 Gyoda ................ H01L 27/3293
257/432
8,610,118 B2 * 12/2013 Yamazaki ......... G02F 1/133305
257/40
(Continued)

FOREIGN PATENT DOCUMENTS

CN 1925127 A 3/2007
CN 101574759 A 11/2009
(Continued)

OTHER PUBLICATIONS

First Chinese Office Action (including English translation) dated Mar. 25, 2016, for corresponding Chinese Application No. 201410262342.0.
(Continued)

*Primary Examiner* — Bac Au
(74) *Attorney, Agent, or Firm* — Kinney & Lange, P.A.

(57) ABSTRACT

An embodiment of the present invention provides a method for producing a flexible display panel. The method includes the following steps of: providing a bearing substrate and a transparent substrate arranged with the flexible display panel; setting a laser irradiation path and irradiating the bearing substrate by using a laser along the set laser irradiation path to form a mark region on the bearing substrate; placing the flexible display panel on the mark region correspondingly; irradiating from a side of the transparent substrate by re-using the laser along the set laser irradiation path, to peel off the flexible display panel from the trans-
(Continued)

parent substrate; and separating the flexible display panel from the mark region on the bearing substrate to obtain the flexible display panel.

20 Claims, 4 Drawing Sheets

(51) Int. Cl.
  *H01L 27/12* (2006.01)
  *H01L 21/84* (2006.01)
  *G02F 1/1333* (2006.01)
  *H01L 51/56* (2006.01)

(52) U.S. Cl.
  CPC .......... *H01L 27/12* (2013.01); *H01L 27/1214* (2013.01); *H01L 27/1266* (2013.01); *H01L 27/3241* (2013.01); *H01L 27/3244* (2013.01); *H01L 27/3248* (2013.01); *H01L 51/0024* (2013.01); *H01L 51/0097* (2013.01); *H01L 51/56* (2013.01); *H01L 2227/323* (2013.01); *H01L 2227/326* (2013.01); *H01L 2251/5338* (2013.01); *Y02E 10/549* (2013.01)

(56) References Cited

U.S. PATENT DOCUMENTS

| | | | | |
|---|---|---|---|---|
| 9,355,877 | B2* | 5/2016 | Lee | ...................... H01L 21/6835 |
| 2013/0089954 | A1* | 4/2013 | Ro | ........................ H01L 51/003 |
| | | | | 438/113 |
| 2014/0008657 | A1* | 1/2014 | Lu | ........................... H01L 33/16 |
| | | | | 257/59 |

FOREIGN PATENT DOCUMENTS

| | | |
|---|---|---|
| CN | 102722301 A | 10/2012 |
| CN | 103140953 A | 6/2013 |
| CN | 103185977 A | 7/2013 |
| CN | 103413775 A | 11/2013 |
| CN | 103700662 A | 4/2014 |
| CN | 103855171 A | 6/2014 |
| CN | 104022062 A | 9/2014 |
| KR | 20130045749 A | 5/2013 |

OTHER PUBLICATIONS

International Search Report and Written Opinion dated Feb. 26, 2015 in corresponding PCT Application No. PCT/CN2014/086842.

* cited by examiner

S101: providing a bearing substrate and a transparent substrate arranged with the flexible display panel

S102: setting a laser irradiation path and irradiating the bearing substrate by using a laser along the set laser irradiation path to form a mark region on the bearing substrate

S103: placing the flexible display panel on the mark region correspondingly

S104: irradiating from a side of the transparent substrate by re-using the laser along the set laser irradiation path, to peel off the flexible display panel from the transparent substrate

S105: separating the flexible display panel from the mark region on the bearing substrate to obtain the flexible display panel

Fig. 1

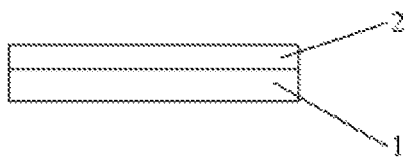

Fig. 2

METHOD FOR PRODUCING FLEXIBLE DISPLAY PANEL

BACKGROUND OF THE INVENTION

Field of the Invention

The present disclosure relates to the technical field of display, and in particular, relates to a method for producing a flexible display panel.

Description of the Related Art

As the display technology develops, a flexible display panel becomes used more and more widely. The flexible display panel has a flexible substrate which tends to be deformed, thus, during producing the flexible display panel, problems such as positioning, transport and storage of the flexible substrate all become difficult relatively. Typically, at first, a flexible material layer is formed on a transparent substrate, then a buffer layer and various display arrangements are formed on the flexible material layer (for example, for a flexible OLED display panel, it includes such as thin film transistors, data lines, gate lines, capacitors, an anode, an organic light emitting layer, a cathode, a pixel definition layer), and subsequently, the flexible material layer is irradiated by an ultraviolet laser from the side on which the transparent substrate is arranged to reduce the adhesive force between the flexible material layer and the transparent substrate. In this way, the flexible material layer bearing the various display arrangements is peeled off from the transparent substrate, i.e., laser peeling-off, so as to achieve the flexible display panel.

In view of above, the flexible material layer to be peeled off needs to be aligned accurately before the laser peel-off operation, which causes difficulty in production process and reduces the efficiency of producing the flexible display panel.

SUMMARY OF THE INVENTION

The technical problem to be solved in the present disclosure is to provide a method for producing a flexible display panel that does not need to accurately align the flexible material layer to be peeled off before the laser peel-off operation, which reduces difficulty in production process and improves the efficiency of producing the flexible display panel.

In one aspect of the present invention, it provides a method for producing a flexible display panel, comprising the following steps of:

providing a bearing substrate and a transparent substrate arranged with the flexible display panel;

setting a laser irradiation path and irradiating the bearing substrate by using a laser along the set laser irradiation path to form a mark region on the bearing substrate;

placing the flexible display panel on the mark region correspondingly;

irradiating from a side of the transparent substrate by re-using the laser along the set laser irradiation path, to peel off the flexible display panel from the transparent substrate; and separating the flexible display panel from the mark region on the bearing substrate to obtain the flexible display panel.

In an embodiment, the bearing substrate is provided with a layer of amorphous silicon thereon.

In an embodiment, the step of irradiating the bearing substrate by using a laser along the set laser irradiation path further comprises: irradiating a partial region of the layer of amorphous by using a laser along the set laser irradiation path to form a polycrystalline silicon region as the mark region.

In an embodiment, the mark region has an area greater than or equal to the area of the flexible display panel such that the flexible display panel is located completely within a border range of the mark region.

In an embodiment, the flexible display panel and the transparent substrate have shapes corresponding to each other completely and are aligned with each other, and the transparent substrate and the flexible display panel have areas equal to each other or substantially equal to each other.

In an embodiment, the method further comprises a step of connecting the flexible display panel to a flexible circuit board outside the transparent substrate.

In an embodiment, the flexible circuit board has a longitudinal direction perpendicular to an edge of the flexible display panel connected to the flexible circuit board or parallel to the edge or inclined with respect to the edge at an angle.

In an embodiment, the method further comprises a step of fixing the flexible circuit board on the bearing substrate.

In an embodiment, the step of fixing the flexible circuit board on the bearing substrate further comprises adhesively fixing the flexible circuit board on a region on the bearing substrate other than the mark region by a high temperature adhesive tape or a double-sided adhesive tape.

In an embodiment, the edge of the flexible display panel connected to the flexible circuit board is aligned with a corresponding edge of the mark region or projects outside the mark region.

In an embodiment, the edge of the flexible display panel projects outside the mark region by a distance in a range of 0-10 millimeters.

In an embodiment, the edge of the flexible display panel projects outside the mark region by a distance in a range of 0-1 millimeter.

In an embodiment, the step of placing the flexible display panel on the mark region correspondingly further comprises:

placing flexible display panels on one or a plurality of transparent substrate side by side, on at least one of the mark region correspondingly.

In an embodiment, the mark region has a shape of rectangle, square, ellipse, circle or triangle or has another suitable shape.

In an embodiment, the plurality of transparent substrates provided with flexible display panels are obtained by cutting a plurality of flexible display panels on a layer of flexible material formed on the same transparent substrate.

In an embodiment, the set laser irradiation path is a path extending from a weld side of the flexible display panel connected to the flexible circuit board to an opposed side to this weld side, a path perpendicular to this extending path or a path inclined at an angle with respect to this extending path.

In an embodiment, the transparent substrate is a glass substrate.

In an embodiment, the laser is produced from an excimer laser source.

BRIEF DESCRIPTION OF THE DRAWINGS

In order to describe the technical solutions of the embodiments of the present invention more clearly, the drawings used for explaining the embodiments will be explained briefly. Apparently, the following drawings show only some embodiments of the present invention. From these drawings, the skilled person in the art may further envisage other drawings without taking any inventive labors.

FIG. 1 is a flow chart schematically showing a method for producing a flexible display panel according to a first embodiment of the present invention;

FIG. 2 is a side view of a transparent substrate provided with a flexible display panel in the method shown in FIG. 1;

EXPLANATION OF NUMERAL REFERENCES

Figure 3:
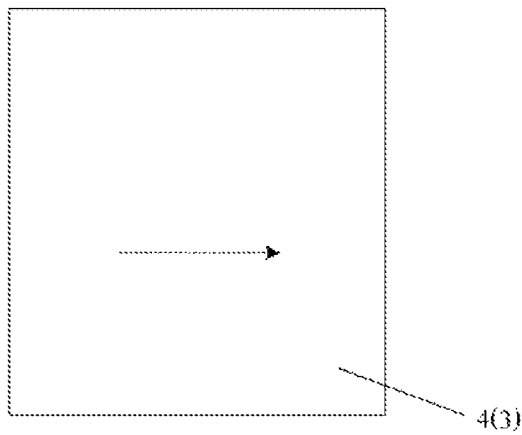
FIG. 3 is a top view of a bearing substrate in the method shown in FIG. 1, where the set laser irradiation path is shown.

1: transparent substrate; 2: flexible display panel; 3: bearing substrate; 4: amorphous silicon layer; 5: polycrystalline silicon region or mark region; 6: flexible circuit board

DETAILED DESCRIPTION OF PREFERRED EMBODIMENTS

Technical solutions of exemplary embodiments of the present disclosure will below be described clearly and fully in detail with reference to the attached drawings. Apparently, some of the embodiments are only given by way of examples, instead of all of embodiments of the present invention. All of the other embodiments that the skilled person in the art may obtain based on the embodiments of the present invention without taking inventive labors belong to the protect scope of the present invention.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the present invention provides a method for producing a flexible display panel, as illustrated in FIG. 1. The method includes the following steps of:

S101: providing a bearing substrate and a transparent substrate arranged with the flexible display panel;

S102: setting a laser irradiation path and irradiating the bearing substrate by using a laser along the set laser irradiation path to form a mark region on the bearing substrate;

S103: placing the flexible display panel on the mark region correspondingly;

S104: irradiating from a side of the transparent substrate by re-using the laser along the set laser irradiation path again, to peel off the flexible display panel from the transparent substrate;

S105: separating the flexible display panel from the mark region on the bearing substrate to obtain the flexible display panel.

It should be noted that one or more mark regions may be provided in an embodiment of the present invention. That is, at least one mark regions may be formed on the bearing substrate. For the convenience of description, in the following description and drawings, only one mark region is given as an example.

Below, the details of the respective steps will be explained in detail with reference to the drawings.

In the step S101, the transparent substrate 1 provided with the flexible display panel 2 is provided, as illustrated in FIG. 2. The transparent substrate 1 is formed with a flexible material layer (not shown) thereon. The flexible material layer is mainly made from organic material such as polyimide or polyethylene terephthalate. Then, a buffer layer and various display arrangements are formed on the flexible material layer in sequence. For example, for a flexible OLED display panel, the display arrangements include elements such as thin film transistors, data lines, gate lines, capacitors, an anode, an organic light emitting layer, a cathode, a pixel definition layer. In this way, the flexible display panel 2 is formed on the transparent substrate 1. In addition, the transparent substrate 1 is preferably a glass substrate. As the entire processing procedure is performed below 600° C., the conventional glass substrate may be applicable.

In an example of the present invention, the flexible display panel 2 and the transparent substrate 1 have shapes corresponding to each other completely and are aligned with each other. In this way, the transparent substrate 1 and the flexible display panel 2 have areas equal to each other or substantially equal to each other.

The bearing substrate provided in the step S101 is shown in FIG. 3. The bearing substrate 3 is provided with a layer 4 of amorphous silicon thereon. The reference numeral 4(3) in FIG. 3 means that only the layer 4 of amorphous silicon is visible in the drawing while the bearing substrate 3 is not visible as it is located below the layer 4 of amorphous silicon. In the following drawings, the reference numerals are marked in the same manner and thus the explanations for them will be omitted herein.

Figure 4:
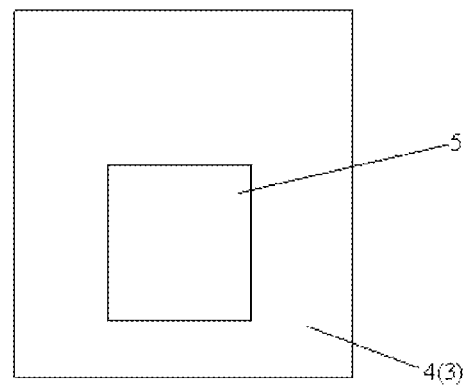
FIG. 4 is a top view of a bearing substrate with a mark region produced in the method shown in FIG. 1.

In the step S102, the layer 4 of amorphous on the bearing substrate 3 is irradiated by a laser along the set laser irradiation path to form a rectangular polycrystalline silicon region 5 as the mark region on the bearing substrate 3, as illustrated in FIG. 4.

It should be understood that there are various processes for forming the mark region such as by the laser and the above solution is only one of these processes. The above specific solution is intended to only explain the method according to the embodiment of the present invention by way of examples, instead of limiting the present invention.

FIG. 3 shows the set laser irradiation path in the embodiment. The irradiation may be performed by the laser produced from an excimer laser source along the laser irradiation path, that is, the laser travels from left to right shown in FIG. 3. After the layer 4 of amorphous silicon absorbs the energy of the laser, the polycrystalline silicon region 5 may be formed. That is, by means of laser irradiation, the layer 4 of amorphous silicon in any region on the bearing substrate 3 is converted into the polycrystalline silicon region 5. On the basis of the set laser irradiation path in advance, the position and size of the polycrystalline silicon region 5 on the bearing substrate 3 may be controlled to facilitate the subsequent production and operation.

In the step S103, the flexible display panel 2 is placed on the mark region 5 correspondingly. For example, the transparent substrate 1 provided with the flexible display panel 2 is arranged inversely on the bearing substrate 3 such that the flexible display panel 2 is placed corresponding to the mark region 5 and is located between the transparent substrate 1 and the bearing substrate 3. Certainly, the flexible display panel 2 may also be placed on the mark region 5 in other suitable means.

Figure 5:
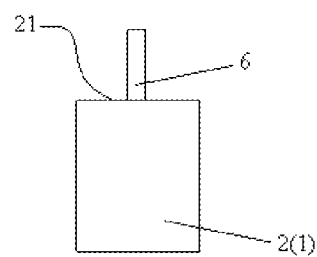
FIG. 5 is a top view of the flexible display panel provided with a flexible circuit board produced in the method shown in FIG. 1, where the flexible display panel is arranged on the transparent substrate.

However, in fact, in order to provide signals such as electrical signals or imaging signals for the flexible display panel 2, the flexible display panel 2 is also connected to a flexible circuit board 6, as shown in FIG. 5. The laser may degrade the electrical performance of the flexible circuit board 6 and the transparent substrate 1 and the flexible display panel 2 which it bears typically have the same area, thus, the flexible circuit board 6 is typically located outside the transparent substrate 1. In this way, the laser may be forced to be applied to only the mark region 5 or the flexible display panel 2 and the transparent substrate 1 (it will be discussed below) on the mark region 5, so as to prevent the flexible circuit board 6 from being irradiated by the laser.

FIG. 5 shows that the flexible circuit board 6 has a longitudinal direction or extending direction perpendicular to an edge 21 of the flexible display panel 2 connected to the flexible circuit board 6. As shown, the flexible circuit board 6 is substantially rectangular. In this way, it may ensure a short side of the flexible circuit board 6 is connected to the edge 21 of the flexible display panel 2 such that the laser irradiates the flexible circuit board 6 as low as possible. Certainly, it may also provide an orientation of the flexible circuit board 6 with respect to the flexible display panel 2 as required, for example, the flexible circuit board 6 may be parallel to the edge 21 or inclined with respect to the edge 21 at an angle.

In an example, in order to prevent the relative position of the transparent substrate 1 and the bearing substrate 3 from changing during the laser irradiation to influence the peel-off effect of the flexible display panel 2, the flexible circuit board 6 may be fixed on the bearing substrate 3 such that the transparent substrate 1 and the bearing substrate 3 have a fixed relative position. In particular, the flexible circuit board 6 may be fixed on any region on the bearing substrate 3 other than the mark region 5 by adhesives such as a high temperature adhesive tape or a double-sided adhesive tape. By means of fixing the transparent substrate 1 on the bearing substrate 3, the relative position of the flexible display panel 2 and the polycrystalline silicon region 5 are kept constant in the subsequent operations to ensure the flexible display panel 2 to be separated from the transparent substrate 1 successfully.

Figure 6:
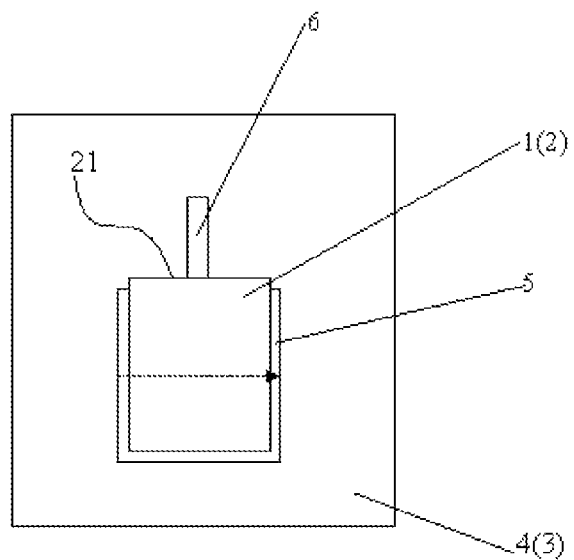
FIG. 6 is a top view of the flexible display panel in FIG. 5 arranged on the bearing substrate shown in FIG. 4 correspondingly.

Further, in consideration that the flexible circuit board 6 connected to the flexible display panel 2 may be subject to adverse effects such as degradation of performance when it is irradiated by the laser, as shown in FIG. 6, the edge (the edge 21 shown in FIG. 6) of the flexible display panel 2 connected to the flexible circuit board 6 may be aligned with the corresponding edge of the mark region 5 or projects outside the mark region 5. In this way, it may prevent the flexible circuit board 6 from being irradiated by the laser. Preferably, the edge 21 of the flexible display panel 2 projects outside the mark region 5 by a distance in a range of 0-10 millimeters, more preferably, in a range of 0-1 millimeter, in this example being about 1 millimeter. Although the part of the flexible display panel 2 having a width of approximate 1 millimeter which projects outside the mark region 5 is not subject to the laser irradiation, it will not substantially influence the peel-off of the flexible display panel 2 from the transparent substrate 1.

In an example, the mark region 5 has an area greater than or equal to the area of the flexible display panel 2 such that the flexible display panel 2 is located completely within a border range of the mark region 5, that is, it is located within the periphery of the mark region 5 or is aligned with its periphery. In this way, it may alleviate effectively the edge carbonization problem of the flexible display panel 2 in practical laser irradiation process.

Figure 7:
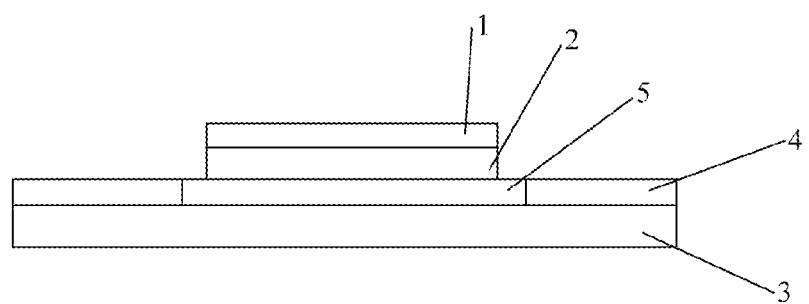
FIG. 7 is a side view of the structure shown in FIG. 6.

As illustrated in FIGS. 6-7, the area of the polycrystalline silicon region 5 as the mark region is greater than the area of the flexible display panel 2. As discussed above, the side of the flexible display panel 2 on which the edge 21 is arranged projects out of the mark region 5 while all of the other parts of the flexible display panel 2 other than the edge 21 are located within a range of the peripheral border of the mark region 5. In this way, the edge carbonization problem of the flexible display panel 2 in the practical laser irradiation process may be prevented completely such that the performance of the flexible circuit board 6 is degraded due to irradiation. In the case that the area of the mark region 5 is greater than the area of the flexible display panel 2, the flexible display panel 2 may be placed correspondingly on or in the mark region 5 more easily, so as to reduce the difficulty in aligning the flexible display panel 2 with the mark region 5.

In the step S104, the irradiation is performed from a side of the transparent substrate 1 again by re-using the laser along the laser irradiation path set in the step S102, to peel off the flexible display panel 2 from the transparent substrate 1.

As indicated by the dashed line in FIG. 6, the same laser irradiation path as that in the step S102 is shown. In this way, the laser will be applied to only the polycrystalline silicon region 5 formed previously and the flexible display panel 2 and the transparent substrate 1 arranged on the polycrystalline silicon region 5. As the laser irradiates it from the top in FIG. 7, the adhesive force between the flexible material layer of the flexible display panel 2 and the transparent substrate 1 may be reduced such that the flexible display panel 2 is peeled off from the transparent substrate 1.

It should be understood that, by means of performing the laser irradiation peel-off by the same laser irradiation path as that in the step S102, the step of positioning accurately the flexible material layer to be peeled off before the laser irradiation peel-off, as described in the prior art can be omitted herein. That is, by following the laser irradiation path in the step S102, it does not need to align the flexible material layer of the flexible display panel 2 with the laser accurately. It may ensure that the laser is applied to only the region of the flexible display panel 2 and the transparent substrate 1 corresponding to the mark region 5, to peel off the flexible display panel 2 from the transparent substrate 1. In this way, the difficulty in producing the flexible display panel 2 may be reduced, the efficiency of producing the flexible display panel 2 may be improved and the production costs of the flexible display panel 2 may be reduced.

It should be understood that, as illustrated in FIG. 6, the set laser irradiation path for irradiation may be parallel to the edge 21, or may be perpendicular to the edge 21. That is, the set laser irradiation path is a path extending from a weld side (i.e., the side on which the edge 21 is arranged) of the flexible display panel 2 connected to the flexible circuit board 6 to an opposed side to this weld side, a path perpendicular to this extending path or a path inclined at an angle to this extending path.

In the step S105, the final flexible display panel 2 can be obtained by separating the flexible display panel 2 from the mark region 5 on the bearing substrate 3. In the case that the flexible circuit board 6 is fixed adhesively on the bearing substrate 3, the flexible circuit board 6 may be removed by a relatively small force from the bearing substrate 3, so as to separate the flexible display panel 2 from the bearing substrate 3.

Figure 8:
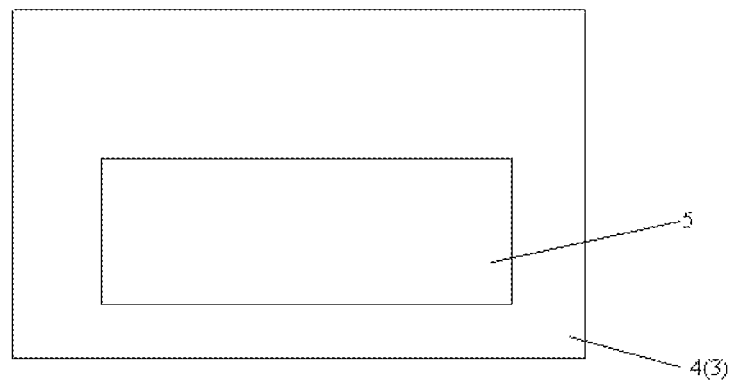
FIG. 8 is a top view showing a variant embodiment of the bearing substrate with the mark region produced in the method according to the present disclosure.

FIG. 8 shows the bearing substrate 3 according to another embodiment of the present invention. In comparison with FIG. 4, it is distinguished in that the mark region 5 on the bearing substrate 3 has a larger area although it also has the rectangular shape, so as to receive the transparent substrate 1 provided with a plurality of flexible display panels 2.

Figure 9:
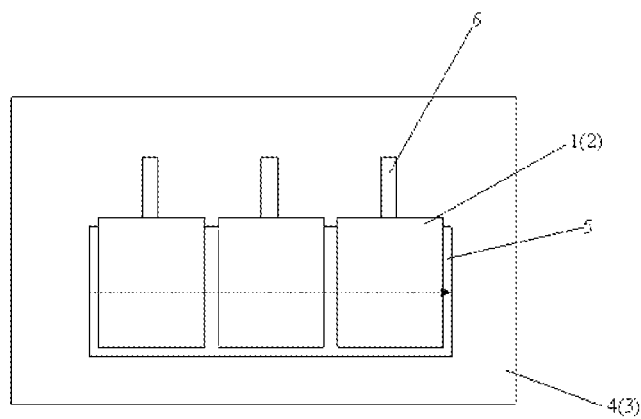
FIG. 9 is a top view showing a plurality of flexible display panel shown in FIG. 5 arranged on the bearing substrate shown in FIG. 8 correspondingly.

FIG. 9 shows three transparent substrates 1 provided with the flexible display panels 2 arranged side by side on the mark region 5. It is distinguished from the arrangement shown in FIG. 6 in that the three transparent substrates 1 are placed correspondingly on the mark region 5 spaced to each other. It should be noted that the three flexible display panels 2 may be arranged side by side on the mark region 5. They may be spaced to each other or contact with each other. In consideration that the arrangement of these structures and the means of laser irradiation are same to the above description, the details will be omitted herein.

In FIG. 9, the laser irradiation path is indicated by the dashed line parallel to a long side of the mark region 5. At that time, the flexible display panels 2 on the three transparent substrates 1 arranged on the polycrystalline silicon region 5 can be irradiated by the laser. In this way, three separate (or produced individually) flexible display panels 2 and the three transparent substrates 1 may be peeled off together, so as to improve the production efficiency of the flexible display panel 2 significantly.

It should be understood that, although in the above example, the mark region 5 has the rectangular shape to help the illustration, the mark region 5 may have a shape of square, ellipse, circle or triangle or has another suitable shape.

The examples shown in FIGS. 8-9 have an advantage, that is, it may also be adapted to produce the plurality of flexible display panels on the same flexible material layer on the same transparent substrate together.

In an example, a flexible material layer may be formed by production processes such as coating on a larger transparent substrate, and then the buffer layer and various display arrangements are formed on different regions of the flexible material layer respectively. The different regions on the flexible material layer are mutually independent without contacting with each other. That is, the larger transparent substrate may be formed with a plurality of flexible display panels thereon and the respective flexible display panels are mutually independent without contacting with each other. However, these flexible display panels are still connected by the flexible material layer. In order to prevent the flexible material layer among the respective flexible display panels from disturbing the laser peel-off in the laser irradiation process, the larger transparent substrate is cut. In particular, the larger transparent substrate is cut into a plurality of smaller transparent substrates, each of which is same to the transparent substrate provided by the step S101 of the present disclosure.

Although several exemplary embodiments have been shown and described, the present invention is not limited to those and it would be appreciated by those skilled in the art that various changes or alternations may be made in these embodiments without departing from the scope of the disclosure. These changes or alternations should fall within the scope of the present invention. Therefore, the scope of the present invention is defined in the attached claims.

What is claimed is:

1. A method for producing a flexible display panel, comprising:
providing a bearing substrate and a transparent substrate arranged with the flexible display panel;
setting a laser irradiation path and irradiating the bearing substrate by using a laser along the set laser irradiation path to form a mark region on the bearing substrate;
placing the flexible display panel on the mark region correspondingly;
irradiating from a side of the transparent substrate by re-using the laser along the set laser irradiation path, to peel off the flexible display panel from the transparent substrate; and
separating the flexible display panel from the mark region on the bearing substrate to obtain the flexible display panel.

2. The method according to claim 1, wherein the bearing substrate is provided with a layer of amorphous silicon thereon.

3. The method according to claim 2, wherein the step of irradiating the bearing substrate by using a laser along the set laser irradiation path further comprises: irradiating a partial region of the layer of amorphous silicon by using a laser along the set laser irradiation path to form a polycrystalline silicon region as the mark region.

4. The method according to claim 2, wherein the mark region has an area greater than or equal to the area of the flexible display panel such that the flexible display panel is located completely within a border range of the mark region.

5. The method according to claim 4, wherein the flexible display panel and the transparent substrate have shapes corresponding to each other and are aligned with each other, and the transparent substrate and the flexible display panel have areas equal to each other or substantially equal to each other.

6. The method according to claim 1, wherein the mark region has an area greater than or equal to an area of the flexible display panel such that the flexible display panel is located completely within a border range of the mark region.

7. The method according to claim 1, wherein the flexible display panel and the transparent substrate have shapes corresponding to each other completely and are aligned with each other, and the transparent substrate and the flexible display panel have areas equal to each other or substantially equal to each other.

8. The method according to claim 1, further comprising a step of connecting the flexible display panel to a flexible circuit board outside the transparent substrate.

9. The method according to claim 8, wherein the flexible circuit board has a longitudinal direction perpendicular to an edge of the flexible display panel connected to the flexible circuit board or parallel to the edge or inclined with respect to the edge at an angle.

10. The method according to claim 8, further comprising a step of fixing the flexible circuit board on the bearing substrate.

11. The method according to claim 8, wherein the step of fixing the flexible circuit board on the bearing substrate further comprises adhesively fixing the flexible circuit board on a region on the bearing substrate other than the mark region by a high temperature adhesive tape or a double-sided adhesive tape.

12. The method according to claim 8, wherein an edge of the flexible display panel connected to the flexible circuit board is aligned with a corresponding edge of the mark region or projects outside the mark region.

13. The method according to claim 12, wherein the edge of the flexible display panel projects outside the mark region by a distance in a range of 0-10 millimeters.

14. The method according to claim 13, wherein the edge of the flexible display panel projects outside the mark region by a distance in a range of 0-1 millimeter.

15. The method according to claim 1, wherein the step of placing the flexible display panel on the mark region correspondingly further comprises:
    placing flexible display panels on one or a plurality of transparent substrates side by side, on at least one mark region correspondingly.

16. The method according to claim 1, wherein the mark region has a shape of rectangle, square, ellipse, circle or triangle or has another suitable shape.

17. The method according to claim 15, wherein the plurality of transparent substrates provided with flexible display panels are obtained by cutting a plurality of flexible display panels on a layer of flexible material formed on the same transparent substrate.

18. The method according to claim 1, wherein the set laser irradiation path is a path extending from a weld side of the flexible display panel connected to the flexible circuit board to an opposed side to this weld side, a path perpendicular to this extending path or a path inclined at an angle with respect to this extending path.

19. The method according to claim 1, wherein the transparent substrate is a glass substrate.

20. The method according to claim 1, wherein the laser is produced from an excimer laser source.

* * * * *